United States Patent
Raychaudhuri et al.

(10) Patent No.: US 6,797,129 B2
(45) Date of Patent: Sep. 28, 2004

(54) ORGANIC LIGHT-EMITTING DEVICE STRUCTURE USING METAL CATHODE SPUTTERING

(75) Inventors: Pranab K. Raychaudhuri, Rochester, NY (US); Joseph K. Madathil, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 31 days.

(21) Appl. No.: 10/161,005

(22) Filed: Jun. 3, 2002

(65) Prior Publication Data

US 2003/0224203 A1 Dec. 4, 2003

(51) Int. Cl.[7] .............................. C23C 14/34; B05D 3/02
(52) U.S. Cl. ........................ 204/192.15; 204/192.12; 427/372.2; 427/383.1; 427/384; 427/404; 427/419.1
(58) Field of Search ................ 204/192.12, 192.15; 427/372.2, 383.1, 384, 404, 419.1

(56) References Cited

U.S. PATENT DOCUMENTS

| | | | |
|---|---|---|---|
| 4,720,432 A | 1/1988 | VanSlyke et al. | 428/457 |
| 4,769,292 A | 9/1988 | Tang et al. | 428/690 |
| 4,885,211 A | 12/1989 | Tang et al. | 428/457 |
| 5,645,948 A | 7/1997 | Shi et al. | 428/690 |
| 5,935,721 A | 8/1999 | Shi et al. | 428/690 |
| 6,020,078 A | 2/2000 | Chen et al. | 428/690 |
| 6,198,220 B1 * | 3/2001 | Jones et al. | 313/512 |
| 6,208,077 B1 | 3/2001 | Hung | 313/506 |
| 6,248,458 B1 * | 6/2001 | Yoon et al. | 428/690 |

FOREIGN PATENT DOCUMENTS

| | | | |
|---|---|---|---|
| DE | 19807370 | 7/1999 | H05B/33/26 |
| EP | 0876086 | 11/1998 | H05B/33/26 |
| EP | 0880305 | 11/1998 | H05B/33/26 |
| EP | 0880307 | 11/1998 | H05B/33/26 |
| EP | 0982783 | 3/2000 | H01L/51/20 |

OTHER PUBLICATIONS

Liao et al, Ion–beam–Induced surface damages on tris–(–8–hydroxyquinoline) aluminum, Applied Physics Letters, vol. 75, No. 11, Sep. 1999, pp. 1619–1621.

Hung et al, Sputter deposition of cathodes in organic light emitting diodes, J. of Applied Physics, vol. 86, No. 8, Oct. 1999, pp. 4607–4612.

Mason et al, Interfacial chemistry of Alq3 and LiF with Reactive Metals, J. of Applied Physics, Vo. 89, No. 5, Mar. 1, 1999, pp. 2756–2765.

Parthasarathy et al, A metal–free cathode for organic semiconductor devices, Applied Physics Letters, vol. 72, No. 17, Apr. 27, 1998, pp. 2138–2140.

* cited by examiner

Primary Examiner—Steven VerSteeg
(74) Attorney, Agent, or Firm—Raymond L. Owens

(57) ABSTRACT

An OLED device, including a substrate, an anode formed of a conductive material disposed over the substrate, an emissive layer having an electroluminescent material provided over the anode layer, a buffer layer, provided over the emissive layer and including phthalocyanine or derivatives thereof, an electron injecting dopant source layer provided over the buffer layer and including a compound of an alkali metal or thermal decomposition products thereof; and a sputtered layer of a metal or metal alloy provided over the buffer layer and selected to function with the buffer layer to inject electrons into the emissive layer.

25 Claims, 1 Drawing Sheet

US 6,797,129 B2

ORGANIC LIGHT-EMITTING DEVICE STRUCTURE USING METAL CATHODE SPUTTERING

CROSS REFERENCE TO RELATED APPLICATIONS

Reference is made to commonly assigned U.S. Pat. No. 6,579,629, issued Jun. 17, 2003, entitled "Cathode Layer in Organic Light-Emitting Diode Devices" by Raychaudhuri et al., and commonly assigned U.S. Pat. No. 6,551,725, issued Apr. 22, 2003, entitled "Inorganic Buffer Structure for Organic Light-Emitting Diode Devices" by Raychaudhuri et al., and commonly assigned and copending U.S. patent application Ser. No. 09/956,411, filed Sep. 19, 2001, entitled "Sputtered Cathode Having a Heavy Alkali Metal Halide in an Organic Light Light-Emitting Device Structure" by Madathil et al., and commonly assigned and copending U.S. patent application Ser. No. 10/161,586 (docket 84576) filed Jun. 3, 2002, entitled "Sputtered Cathode For An Organic Light-Emitting Device Having an Alkali Metal Compound in the Device Structure" by Raychaudhuri et al, the disclosures of which are incorporated herein.

FIELD OF THE INVENTION

The present invention relates to organic light-emitting diode devices and methods for making such devices, which use an organic buffer layer and a sputtered metal or metal alloy layer on such organic buffer layer.

BACKGROUND OF THE INVENTION

Organic electroluminescent (OEL) device, alternately known as organic light-emitting diode (OLED), is useful in flat-panel display applications. This light-emissive device is attractive because it can be designed to produce red, green, and blue colors with high luminance efficiency, operable with a low driving voltage of the order of a few volts and viewable from oblique angles. These unique attributes are derived from a basic OLED structure comprising a multilayer stack of thin films of small-molecule organic materials sandwiched between an anode and a cathode. Tang et al. in commonly assigned U.S. Pat. Nos. 4,769,292 and 4,885,211 have disclosed such a structure. The common electroluminescent (EL) medium is comprised of a bilayer structure of a hole-transport layer (HTL) and an electron-transport layer (ETL), typically of the order of a few tens of nanometer (nm) thick for each layer. The anode material is usually an optically transparent indium tin oxide (ITO) film on glass, which also serves as the substrate for the OLED. The cathode is typically a reflective thin film. Selection of electrode materials is based on work functions. ITO is most commonly used as the anode because it has a high work function. Mg:Ag alloys are generally used as electron-injecting contacts because they have lower work functions. Lithium containing alloys such as Al:Li and LiF/Al contacts also provide efficient electron injection. The device emits visible light in response to a potential difference applied across EL medium. When an electrical potential difference is applied at the electrodes, the injected carriers-hole at the anode and electron at the cathode-migrate towards each other through EL medium and a fraction of them recombine to emit light.

In the fabrication of OLED devices, vapor deposition methods are often used. Using these methods, the organic layers are deposited in thin-film forms onto ITO glass substrates in a vacuum chamber, followed by deposition of the cathode layer. Among the deposition methods for the cathode, vacuum deposition using resistive heating or electron-beam heating has been found to be most suitable because it does not cause damage to the organic layers. However, it would be highly desirable to avoid these methods for fabrication of cathode. This is because these processes are inefficient. In order to realize low cost manufacturing, one must adopt and develop a proven robust high-throughput process specific to OLED fabrication. Sputtering has been used as a method of choice for thin film deposition in many industries. Conformal, dense, and adherent coatings, short cycle time, low maintenance of coating chamber, and efficient use of materials are some of the benefits of sputtering.

Sputtering is not commonly practiced for fabrication of the OLED cathodes because of the potential damage inflicted on the organic layers and the degradation of device performance. Sputter deposition takes place in a high energy and complex environment that is comprised of energetic neutrals, electrons, positive and negative ions, and emissions from the excited states that can degrade the organic layers upon which the cathode is deposited.

Liao et al. (Appl. Phys. Lett. 75, 1619 [1999]) investigated using x-ray and ultraviolet photoelectron spectroscopies the damages induced on Alq surfaces by 100 eV $Ar^+$ irradiation. The core level electron density curves show that some N—Al and C—O—Al bonds in Alq molecules were broken. The valance band structure was also tremendously changed implying the formation of a metal-like conducting surface. It was suggested that this would cause nonradiative quenching in OLEDs when electrons are injected into the Alq layer from the cathode and also would result in electrical shorts.

During sputter deposition of the cathode, the Alq surface is subjected to high doses of $Ar^+$ bombardments at several hundred volts. As shown by Hung et al. (J. Appl. Phys. 86, 4607 [1999]), a dose only of $9 \times 10^{14}/cm^2$ alters the valance band structure. Therefore, sputtering a cathode on Alq surface in Ar atmosphere is expected to degrade the device performance.

Sputtering damage is controllable, to some extent, by properly selecting the deposition parameters. European patent applications EP 0 876 086 A2, EP 0 880 305 A1, and EP 0 880 307 A2, Nakaya et al., of TDK Corporation, disclose a method of depositing a cathode by a sputtering technique. After depositing the organic layers, with vacuum still kept, the devices were transferred from the evaporation to a sputtering chamber wherein the cathode layer was deposited directly on the electron-transport layer. The cathode was an Al alloy comprised of 0.1–20 a % Li that additionally contained at least one of Cu, Mg, and Zr in small amounts, and in some cases had a protective overcoat. The OLED devices thus prepared used no buffer layer and it was claimed to have good adhesion at the organic layer/cathode interface, low drive voltage, high efficiency and exhibited a slower rate of development of dark spot. Grothe et al. in Patent Application DE 198 07 370 C1 also disclosed a sputtered cathode of an Al:Li alloy which had relatively high Li content and having one or more additional elements chosen from Mn, Pb, Pd, Si, Sn, Zn, Zr, Cu, and SiC. In all of those examples no buffer was used, yet electroluminescent was produced at lower voltages. Sputtering damage was controlled possibly by employing a low deposition rate. By lowering sputtering power it is expected that damage inflicted on the organic layers can be reduced. At low power, however, the deposition rate can be impracticably low and the advantages of sputtering are reduced or even neutralized.

To minimize damage during high speed sputtering of cathodes, a protective coating on the electron-transport layer can be useful. The protective layer, alternately termed as the buffer layer, must be robust to be effective. However, in addition to being resistant to plasma, a buffer layer must not interfere with the operation of the device and must preserve the device performance. Parthasarathy et al. (Appl. Phys. Lett. 72, 2138 [1998]) reported an application of a buffer layer consisting of copper phthalocyanine (CuPc) and zinc phthalocyanine (ZnPc) during sputtering deposition of a metal free cathode. The buffer layer prevented damage to the underlying organic layers during the sputtering process. Hung et al. (J. Appl. Phys. 86, 4607 [1999]) disclosed the application of CuPc buffer layers that permitted high-energy deposition of alloy cathodes. The cathode contained a low work function component, Li, which was believed to diffuse through the buffer layer and provided an electron-injecting layer between the electron-transport layer and the buffer layer. EP Patent Application 0 982 783 A2, Nakaya et al., disclosed a cathode of Al:Li alloy. The cathode was prepared by sputtering using a buffer layer constructed of a porphyrin or napthacene compound that was deposed between the electron-transport layer and the cathode. The device containing the sputtered electrode exhibited low drive voltage, high efficiency, and retarded dark spot growth. Although efficient devices based on sputtered cathode were disclosed, much was desired to simplify the materials and processes. For example, cathode generally was sputtered from an Al alloy target that contains an alkali metal e.g., Li. With this approach the target itself is the source of the electron-injecting dopant. Due to dissimilar properties particularly with respect to melting point, vapor pressure and other properties of alkali metals and other component metals, fabrication of homogeneous and quality target could be quite difficult. It is desirable to use pure metal, as high quality targets are readily available.

SUMMARY OF THE INVENTION

It is therefore an object of the present invention to provide an improved OLED device structure for injecting electrons either into the electron-transport layer or directly into the emissive layer.

It is another object of the present invention to facilitate the use of sputtering of the cathode layer.

The above objects are achieved in an OLED device, comprising:

a) a substrate;

b) an anode formed of a conductive material disposed over the substrate;

c) an emissive layer having an electroluminescent material provided over the anode layer;

d) a buffer layer, provided over the emissive layer and including phthalocyanine or derivatives thereof;

e) an electron injecting dopant source layer provided over the buffer layer and including a compound of an alkali metal or thermal decomposition products thereof; and f) a sputtered layer of a metal or metal alloy provided over the buffer layer and selected to function with the buffer layer to inject electrons into the emissive layer.

The present invention provides a device structure for an OLED device that offers significant protection against damage during sputtering deposition of cathode layer.

An advantage of the present invention is that damage to organic layers during sputtering is minimized, permitting cathode fabrication at high deposition rates.

Another advantage of the present invention is that the sputtered layer does not require to be an alloy containing an electron injecting dopant.

Another advantage of the present invention is that the sputtered layer can be of pure metal not necessarily of low work-function.

Another advantage of the present invention is that it permits the use of wider manufacturing tolerance.

DETAILED DESCRIPTION OF THE INVENTION

Figure 1:
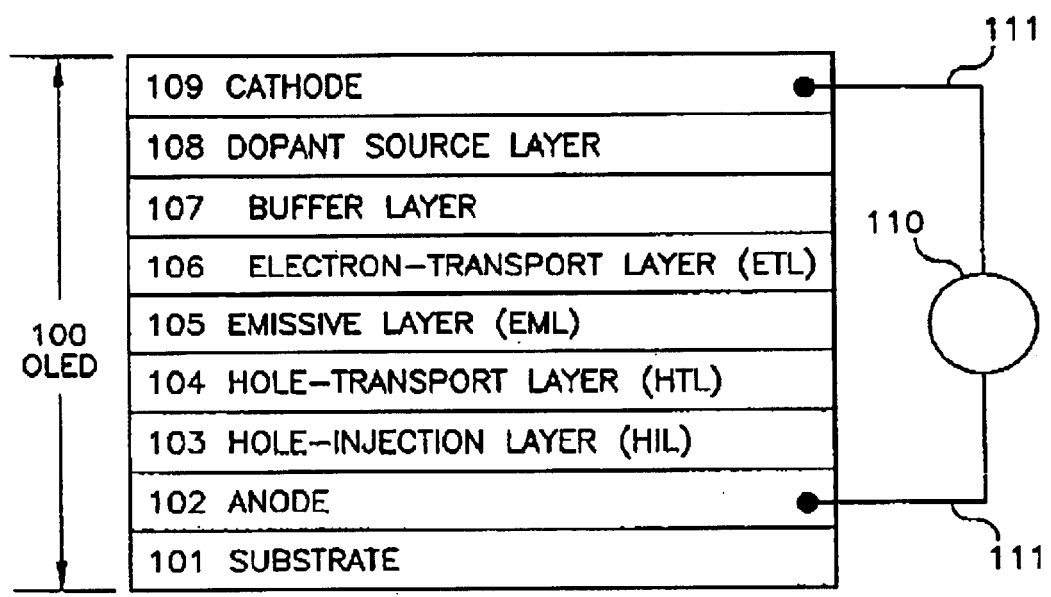
FIG. 1 shows schematically in cross-section the layered structure of the OLED device according to the present invention.

In accordance with the present invention it is believed that an alkali metal is generated from an alkali metal compound as will be described more fully below. The results produced in accordance with the present invention are in any event unexpected. See "Interfacial chemistry of $Alq_3$ and LiF with reactive metals" by Mason et al. (J Appl. Phys. 89(5) 2756 (2001)). From x-ray photoelectron spectroscopy (XPS) and ultraviolet photoelectron spectroscopy (UPS) studies it was found that no reaction occurs when LiF is evaporated on Al or Al on LiF. Yet it was already known that an ALq substrate makes excellent cathode on Alq surface presumably due to formation of radical anion of Alq. It is proposed that radical ions are found only when all three of these constituents are present. In other words, participation of Alq is required for the reaction to take place leading to the function electron injecting contact. It was proposed that participation of Alq is required for the reaction to take place to liberate Li. In devices made in accordance with the present invention it was discovered that such reaction also takes place in the presence of phthalocyanine or derivatives thereof.

Throughout the ensuring description, acronyms are used to designate the names of different layers and operating features of organic light-emitting diode devices. For reference, they are listed in Table 1.

TABLE 1

| | |
|---|---|
| OLED | Organic light-emitting diode |
| ITO | Indium tin oxide |
| HIL | Hole-injection layer |
| HTL | Hole-transport layer |
| EML | Emissive layer |
| ETL | Electron-transport layer |
| NPB | 4,4'-Bis[N-(1-naphthyl)-N-phenylamino]biphenyl (NPB) |
| Alq | Tris(8-hydroxyquinoline) aluminum |
| CuPc | Copper phthalocyanine |
| LiF | Lithium Fluoride |
| KF | Potassium Fluoride |
| RbF | Rubidium Fluoride |
| CsF | Cesium Fluoride |
| $RbNO_3$ | Rubidium Nitrate |
| $KIO_3$ | Potassium Iodate |
| $CsNO_3$ | Cesium Nitrate |
| $CsOOCH_3$ | Cesium Acetate |
| Mg | Magnesium |
| Al | Aluminum |

Turning now to FIG. 1, the OLED device 100 of this invention includes a substrate 101, an anode 102, a hole-injection layer (HIL) 103, a hole-transport layer (HTL) 104, an emissive layer (EML) 105, an electron-transport layer (ETL) 106, a buffer layer 107, an electron injecting dopant source layer 108 (hereafter dopant source layer) and a sputtered cathode 109. By dopant source it is meant that any compound of a dopant element that is appropriate for electron injection to the ETL 106. For example LiF is a dopant source as it can decompose to provide Li, which is an electron injecting dopant to Alq. In operation, the anode 102 and the sputtered cathode 109 are connected to a voltage source 110 via conductors 111 and electrical current is passed through the device layers, resulting in light emission or electroluminescence (EL) from the OLED device. Depending on the optical transparency of the anode 102 and sputtered cathode 109, electroluminescence can be viewed from either the anode side or the cathode side. The intensity of the electroluminescence is dependent on the magnitude of the electrical current that is passed through the OLED device 100, which in turn is dependent on the luminescent and electrical characteristics of the organic layers as well as the charge-injecting nature of the anode 102 and sputtered cathode 108.

The composition and the function of the various layers constituting the OLED device 100 are described as follows.

Substrate 101 may include glass, ceramic, or plastics. Since the OLED device fabrication does not require high temperature process, any substrate that can withstand process temperatures of the order of 100° C. is useful, which includes most thermal plastics. The substrates may take the form of rigid plate, flexible sheet, or curved surfaces. Substrate 101 may include support with electronic backplane, and thus includes active-matrix substrates, which contain electronic addressing and switching elements. Examples of such active-matrix substrates include single-crystal silicon wafer with CMOS circuit elements, substrates with high temperature polysilicon thin-film-transistors, substrates with low temperature polysilicon thin-film-transistors. Those skilled in the art will appreciate that other circuit elements can be used to address and drive the OLED devices.

Anode 102 provides the function of injecting hole into the organic layer when a positive potential relative to the sputtered cathode 109 is applied to the OLED device 100. It has been shown, for example, in commonly assigned U.S. Pat. No. 4,720,432, that indium tin oxide (ITO) forms efficient anode because it has a relatively high work function. Since ITO film itself is transparent, ITO coated glass provides an excellent support for the fabrication of OLED devices. Other suitable anode materials include high work function metals such as Au, Pt, Pd, or alloys of these metals.

Hole-injection layer (HIL) 103 provides the function of increasing the efficiency of the hole-injection from the anode 102 into the organic layers. It has been shown, for example in commonly assigned U.S. Pat. No. 4,885,211, that a porphorinic or phthalocyanine or derivatives thereof compound is useful as a hole injection layer 103, resulting in increased luminance efficiency and operational stability. Other preferred HIL materials include CFx, which is a fluorinated polymer deposited by plasma-assisted vapor deposition, wherein x is less than or equal to 2 and greater than 0. The method of preparation and the characteristics of CFx have been disclosed in commonly assigned U.S. Pat. No. 6,208,077.

Hole-transport layer (HTL) 104 provides the function of transporting holes to the emissive layer (EML) 105. HTL materials include various classes of aromatic amines as disclosed in commonly assigned U.S. Pat. No. 4,720,432. A preferred class of HTL materials includes the tetraaryl-diamines of formula (I).

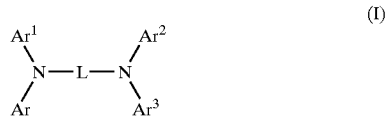

(I)

wherein:

Ar, $Ar^1$, $Ar^2$ and $Ar^3$ are independently selected from among phenyl, biphenyl and naphthyl moieties;

L is a divalent naphthylene moiety or $d_n$;

d is a phenylene moiety;

n is an integer of from 1 to 4; and at least one of Ar, $Ar^1$, $Ar^2$ and $Ar^3$ is a naphthyl moiety.

Useful selected (fused aromatic ring containing) aromatic tertiary amines are the following:

4,4'-Bis[N-(1-naphthyl)-N-phenylamino]biphenyl (NPB)

4,4"-Bis[N-(1-naphthyl)-N-phenylamino]-p-terphenyl 4,4'-Bis[N-(2-naphthyl)-N-phenylamino]biphenyl 1,5-Bis[N-(1-naphthyl)-N-phenylamino]naphthalene 4,4'-Bis[N-(2-pyrenyl)-N-phenylamino]bi-phenyl 4,4'-Bis[N-(2-perylenyl)-N-phenylamino]biphenyl 2,6-Bis(di-p-tolylamino)naphthalene 2,6-Bis[di-(1-naphtyl)amino]naphthalene Emissive layer 105 of FIG. 1 provides the function of light emission produced as a result of recombination of holes and electrons in this layer. A preferred embodiment of the emissive layer comprises of a host material doped with one or more fluorescent dyes. Using this host-dopant composition, highly efficient OLED devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable details for OLED devices using Alq as the host material. As set forth in the Tang et al. commonly assigned U.S. Pat. No. 4,769,292, the emissive layer can contain a green light-emitting doped material, a blue light-emitting doped material, or a red light emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene; 9,10 dianthryl anthracene; and alkyl substituted 9,10 dinaphthyl anthracene, as disclosed in Shi et al. commonly assigned U.S. Pat. No. 5,935,721.

Dopant materials include most fluorescent and phorphorescent dyes and pigments. Preferred dopant materials include coumarins such as coumarin 6, dicyanomethyl-enepyrans such as 4-dicyanomethylene-4H pyrans, as disclosed in Tang et al. commonly assigned U.S. Pat. No. 4,769,292 and in Chen et al. in commonly assigned U.S. Pat. No. 6,020,078.

Electron-transport layer 106 of FIG. 1 provides the function of delivering electrons injected from the cathode to emissive layer 105 of FIG. 1. Useful materials include Alq, benzazoles, as disclosed in commonly assigned Shi et al. commonly assigned U.S. Pat. No. 5,645,948.

Buffer layer 107 of FIG. 1 provides the function of controlling sputter damage during deposition of the cathode and thereby preserve or enhance the performance of OLED device 100. Buffer layer 107 includes the phthalocyanine or derivatives thereof. Information on phthalocyanine can be found in the monograph, "Phthalocyanine Materials" by Neil B. McKeown, Cambridge University Press. 1998, page 3. The preferred materials include metal or metal-free phthalocyanine or derivatives thereof, porphorinic compounds, and the aromatic sextets such as those described by E. Clar in "Aromatic Sextet", John Wiley & Sons, 1972. The preferred range of thickness for buffer layer 107 of FIG. 1 is from 5 to 100 nm.

Electron injecting dopant source layer 108 of FIG. 1 is transparent and includes compounds of alkali metals or their thermal decomposition products. The sputtered cathode 109 is vapor deposited on the dopant source layer 108 of FIG. 1. The alkali metal compounds that are particularly useful as a dopant source are LiF, KF, RbF, CsF, $KIO_3$, $RbNO_3$, $CsNO_3$, and CsOOCCH₃ or their thermal decomposition products. Some alkali metal compounds may evaporate incongruently and the composition of dopant source layer deposited on the buffer layer 107 can differ from the evaporation charge. The dopant layer 108 providing alkali metal dopant can be an electrical insulator and, to be effective, the thickness of dopant source layer 108 of FIG. 1 is likely to be in the range of 0.1 to 10 nm, and more appropriately in the range of 0.2 to 5 nm Sputtered cathode 109 of FIG. 1 is typically a fully reflective thin film, several tens of nm thick, and comprised of materials including alloys capable of efficiently injecting electron to the ETL 106 of FIG. 1. It has been determined in the present invention that efficient cathodes can also be fabricated by sputtering a reactive metal or alloy over the dopant source layer 108 of FIG. 1. For surface emitting devices, the sputtered cathode 109 of FIG. 1 can be made substantially transmissive by minimizing its thickness. Aluminum, a high work function metal, injects electrons very inefficiently when deposited directly on Alq electron-transport layer 106 of FIG. 1. It has been found in the present invention that over the buffer/dopant source combination layer (layer 107/108 of FIG. 1) sputtered Al or Mg function as efficient electron injecting layer. The sputtered cathode 109 can be an alloy of Al or Mg or combinations thereof. The metals other than Al or Mg may also make efficient electron injecting contact in combination with the CuPc/dopant source layer, and these metal can include silicon, scandium, titanium, chromium, manganese, zinc, yittrium, zirconium, or hafnium, or metal alloys thereof.

Although the FIG. 1 embodiment is believed preferred, it will be appreciated by those skilled in the art that a device can also be made which does not use hole-injection layer 103, hole-transport layer 104, and electron-transport layer 106. Those skilled in the art will appreciate that the emissive layer 105 can be selected to include hole-transport and electron-transport functions and the anode layer can function as the hole-injection layer. In such an instance, the device requires 105 and does not require layers 103, 104, and 106.

EXAMPLES

In the following examples, reference should be made to Table 1 for the appropriate structure and operating parameters corresponding to the listed acronym.

Unless otherwise stated, the basic organic EL medium consists of a 75 nm NPB hole-transport layer (HTL) and a 60 nm Alq emitting and electron-transport layer (EML/ETL) deposited on a 42 nm thick ITO anode layer on glass substrates. The NPB and Alq layers were coated in a vacuum coater in single-pump down runs. A batch of these samples was then transferred to a multifunction coater where the remaining layers were deposited in proper sequence to generate various device configurations. The multifunction coater was equipped with evaporation boats, evaporation crucibles, and 2 inch diameter sputter guns. CuPc and alkali metal compounds were evaporated from resistively heated boats, whereas Mg and Al were sputtered. Using one sample a control cell having a LiF/Al bilayer cathode is fabricated where Al from a crucible is deposited by e-beam heating. For sputtering, the deposition chamber was backfilled with pure Ar flowing at 30 SCCM to maintain a fixed pressure, typically 16 mT (milli-Torr). Applying DC power to targets of pure Mg or Al the sputtering deposition was carried out. The deposition rate for Mg was 1.2 nm/s at 80 W, and that for Al was 1.1 nm/s at 120W. It is recognized that deposition rate can easily be controlled by selecting sputtering parameters. Although sputtering from a single target was used, simultaneous sputtering of multiple targets can be employed for increased process throughput. RF, instead of DC, can be used as an alternate power source. It is conceived that instead of a metal layer, an alloy layer with improved properties can be utilized. It is also understood that co-sputtering of several targets, instead of sputtering from a single alloy target, can be employed for adjusting the composition of the alloy layer. The completed devices were encapsulated in a glove box in nitrogen atmosphere and given a heat treatment for several hours at about 70 C. The luminance was then determined as a function of drive current using a PR650 radiometer. The drive voltage V (volt) and luminance L (cd/m²) given the tables are those determined when a current corresponding to 20 mA/cm² was passed through the devices.

Example 1

Table 2 compiles the buffer and cathode structure for an organic EL medium and performance of the resultant device of the present invention and those of a control device. The ITO, HIL, HTL and EML/ETL layers of devices 20 and 21 are identical, and the organic layers were deposited in a single-pump-down run. The control device, 20, which was provided with a standard cathode consisting of a 70 nm thick Al layer on a 0.5 nm LiF layer, exhibits a luminance of 538 cd/m² and an operating voltage of 5.5 volt. The device 21 was provided with a 20 nm thick CuPc buffer layer on which a layer of 0.5 nm thick LiF layer was vapor deposited. Depositing a 50 nm thick Al layer by sputtering completed the device fabrication. The device 21 shows a luminance of 554 cd/m² and an operating voltage of 5.8 V. The device 21 has an operating voltage and a luminance efficiency that are virtually identical to those of the standard device 20. Standard device is assumed free of damage as Al layer was deposited by evaporation. Therefore it is believed during sputtering deposition of Al for the device 21 a high-efficiency electron injecting contact was formed, and that 20 nm thick CuPc eliminated or minimized damage during sputtering deposition of Al.

TABLE 2

Buffer, Cathode Structure, and Performance of a Control and a Sputtered Cathode Devices

| Device ID | Device Type | Buffer CuPc (nm) | LiF (nm) | Evaporated Al (nm) | Sputtered Al (nm) | Drive Voltage (v) | Luminance (cd/m²) |
|---|---|---|---|---|---|---|---|
| 20 | Control | | 0.5 | 70 | | 5.5 | 538 |
| 21 | Sputtered Cathode | 20 | 0.5 | | 50 | 5.8 | 554 |

Example 2

Table 3 compiles the buffer and cathode structure for two devices, 30 and 31. The device 31 is made in accordance with the present invention. The ITO, HIL, HTL and EML/

ETL layers of devices 30 and 31 are identical, and the organic layers were deposited in a single-pump-down run. However, in this experiment instead of a 60 nm thick Alq that was generally used, a thin, 35 nm thick, Alq EML/ETL layer was employed. The device 30 was not provided with a LiF (dopant source) layer, but had a 20 nm thick CuPc buffer layer upon which an Al layer, 50 nm thick, was deposited by sputtering. The device performance is very poor exhibiting only 9 cd/m² and an operating voltage of 8.2 V. It is believed, based on the performance of device 21 (Table 2) that 20 nm thick CuPc layer provided excellent protection from sputter damage, and yet the performance of device 30 is extremely poor in absence of a dopant source layer. When a dopant source layer of 0.5 nm thick LiF was provided on the CuPc layer as in the device 31 the efficiency is enhanced tremendously relative to the device 30. The thickness and deposition parameters for Al sputtering for the device 30 and 31 were identical. It should be noted that the device 31 and device 21 (Table 2), although both efficient, differ in luminance and drive voltage. This is because device 31 has a thin EML/ETL layer. The data of Table 3 show that a dopant source layer is needed for making high-efficiency device.

TABLE 3

Buffer, Cathode Structure, and Performance of Sputtered Cathode Devices with and without LiF, a Dopant Source, Layer

| Device ID | Device Type | Buffer CuPc (nm) | LiF (nm) | Sputtered Al (nm) | Drive Voltage (v) | Luminance (cd/m²) |
|---|---|---|---|---|---|---|
| 30 | Sputtered Cathode | 20 | | 50 | 8.2 | 9 |
| 31 | Sputtered Cathode | 20 | 0.5 | 50 | 4.0 | 416 |

Example 3

In Table 4 compiled are the buffer and cathode structure for an organic EL medium and performance of the resultant devices of the present invention and that of a control device. The ITO, HIL, HTL and EML/ETL layers of devices 40 and 41 are identical, and the organic layers were deposited in a single-pump-down run. However, the ITO anode layer thickness in this example was 85 nm instead of 42 nm that was generally employed.

The control device, 40, which was provided with a standard cathode including a 70 nm thick evaporated Al layer on a 0.5 nm LiF layer, exhibits a luminance of 679 cd/m2 and an operating voltage of 5.8 volt. The device 41 was provided with a 30 nm thick CuPc buffer layer upon which a layer of 0.2 nm thick LiF layer was vapor deposited. Depositing a 50 nm thick Al layer by sputtering completed the device fabrication. The device 41 shows a luminance of 585 cd/m² and an operating voltage of 6.0 V. The device 41 has an operating voltage that is virtually identical to that of the control device 40. It is believed sputtering deposition of Al has not degraded the efficiency in device 41. The luminance of device 41 is lower than that of the device 40 by about 14%, and is believed to have caused by absorption in the 3 nm thick CuPc layer.

TABLE 4

Buffer, Cathode Structure, and Performance of a Control and a Sputtered Cathode Devices

| Device ID | Device Type | Buffer CuPc (nm) | LiF (nm) | Evaporated Al (nm) | Sputtered Al (nm) | Drive Voltage (v) | Luminance (cd/m²) |
|---|---|---|---|---|---|---|---|
| 40 | Control | | 0.5 | 70 | | 5.8 | 679 |
| 41 | Sputtered Cathode | 30 | 0.5 | | 50 | 6.0 | 585 |

Example 4

Table 5 compiles the buffer and cathode structure for a series of devices of the present invention and their performance. The ITO, HIL, HTL and EML/ETL layers of devices 51 through 53 are identical, and the organic layers were deposited in a single-pump-down run. However, in this experiment instead of a 60 nm thick Alq that was generally used, a thin, 35 nm thick, Alq EML/ETL layer was employed. In this series thickness of the LiF dopant source layer is varied, but all the devices have identical sputtered Al layer. It is evident from the data that performance of device is independent of the thickness of the dopant source layer. The drive voltage and luminance of the devices appears to be within the uncertainly of measurements. It should be noted that a relatively thick CuPc layer were used, and a control cell was not made. The drive voltages are lower that those given in Table 2 and Table 4. This is because the EML/ETL layers are thin in this example.

TABLE 5

Buffer, Cathode Structure, and Performance of Sputtered Cathode Devices Having Varying Thicknesses of LiF layer.

| Device ID | Device Type | Buffer CuPc (nm) | LiF (nm) | Sputtered Al (nm) | Drive Voltage (v) | Luminance (cd/m²) |
|---|---|---|---|---|---|---|
| 51 | Sputtered Cathode | 40 | 0.2 | 50 | 4.3 | 491 |
| 52 | Sputtered Cathode | 40 | 0.5 | 50 | 3.6 | 490 |
| 53 | Sputtered Cathode | 40 | 1.0 | 50 | 4.2 | 494 |

Example 5

Table 6 compiles the buffer and cathode structure for a series of devices of the present invention and their performance. The ITO, HIL, HTL and EML/ETL layers of devices 61 through 64 are identical, and the organic layers were deposited in a single-pump-down run. However, here instead of a 60 nm thick Alq that was generally used, a thin, 40 μm thick, Alq EML/ETL layer was employed. In this series the thickness of LiF dopant source layer is varied, and the range of LiF thickness is extended beyond that used in the Example 4. All the devices have identical sputtered Al layers. It is evident that even for 5 nm thick LiF the device functions very well. The performance of devices appears independent of LiF layer thickness in the range of 0.5 to 5 nm. The drive voltage and luminance of all devices appear to be within uncertainty of measurements. It should be noted that in these examples a thin EML/ETL and a relatively thick CuPc layer were used, and a control cell was not been made. It is believed that LiF thickness beyond 5 nm and possibly to 10 nm can also be effective.

TABLE 6

Buffer, Cathode Structure, and Performance of Sputtered Cathode Devices Having Varying Thicknesses of LiF layer

| Device ID | Device Type | Buffer CuPc (nm) | LiF (nm) | Sputtered Al (nm) | Drive Voltage (v) | Luminance (cd/m$^2$) |
|---|---|---|---|---|---|---|
| 61 | Sputtered Cathode | 35 | 0.5 | 70 | 4.2 | 501 |
| 62 | Sputtered Cathode | 35 | 1.0 | 70 | 4.3 | 492 |
| 63 | Sputtered Cathode | 35 | 2.5 | 70 | 4.4 | 525 |

TABLE 6-continued

Buffer, Cathode Structure, and Performance of Sputtered Cathode Devices Having Varying Thicknesses of LiF layer

| Device ID | Device Type | Buffer CuPc (nm) | LiF (nm) | Sputtered Al (nm) | Drive Voltage (v) | Luminance (cd/m$^2$) |
|---|---|---|---|---|---|---|
| 64 | Sputtered Cathode | 35 | 5.0 | 70 | 4.1 | 474 |

Example 6

Table 7 compiles the buffer and cathode structure as well as performance of a series of devices of the present invention and those of a control device. The ITO, HIL, HTL and EML/ETL layers of devices 70 and 73 are identical, and the organic layers were deposited in a single-pump-down run. The control device, 70, which was provided with a standard cathode consisting of a 70 nm thick Al layer on a 0.5 nm LiF layer, exhibits a luminance of 488 cd/m$^2$ and an operating voltage of 5.8 volt. In this study the buffer layer thickness was varied to study the effectiveness of CuPc against Mg sputtering. For all these devices the thickness of Mg layer and sputtering parameters were identical. The device data suggest that Mg is effective in conjunction with LiF and CuPc in providing efficient electron injection. The data also suggest that sputter damage to EL medium has not been completely eliminated in the device 71 as evidenced by its slightly higher operating voltage and somewhat lower luminance than those of the control device 70. It is believed that while the 8 nm thick CuPc buffer layer was largely effective against sputter damage, it has not provided complete protection during sputtering deposition of Mg. Increased CuPc thickness in device 72 has virtually eliminated the sputter damage. Increasing the CuPc thickness beyond 15 nm as in device 73 nm appears not to provide further benefit.

TABLE 7

Buffer, Cathode Structure, and Performance of Sputtered Cathode Devices Having Varying Thicknesses of LiF layer

| Device ID | Device Type | Buffer CuPc (nm) | LiF (nm) | Evaporated Al (nm) | Sputtered Mg (nm) | Drive Voltage (v) | Luminance (cd/m$^2$) |
|---|---|---|---|---|---|---|---|
| 70 | Control |  | 0.5 | 70 |  | 5.8 | 488 |
| 71 | Sputtered Cathode | 8 | 0.5 |  | 70 | 6.2 | 432 |
| 72 | Sputtered Cathode | 15 | 0.5 |  | 70 | 5.9 | 480 |
| 73 | Sputtered Cathode | 25 | 0.5 |  | 70 | 5.7 | 495 |

Example 7

Table 8 compileds the buffer and cathode structure as well as performance of two devices of the present invention and those of a control device.

The ITO, HIL, HTL and EML/ETL layers of devices 80 through 82 are identical. The control device, 80, which was provided with a standard cathode including a 70 nm thick Al layer on a 0.5 nm LiF layer exhibits a luminance of 500 cd/m$^2$ and an operating voltage of 5.8 volt. For devices 81 and 82 of the present invention the rate of CuPc deposition was varied but CuPc thickness was kept constant. An Al layer was provided for each of the devices using identical sputtering parameters. The performance of device 81 and 82 is virtually identical to that of the control device 80. The protective property of CuPc layer appears not to depend on the deposition rate within the range of 0.1 nm/s to 0.4 nm/s.

TABLE 8

Buffer, Cathode Structure, and Performance of a Control and Sputtered Cathode Devices Having 30 nm CuPc layer Deposited at Various Rates

| Device ID | Device Type | CuPc rate (nm/s) | LiF (nm) | Evaporated Al (nm) | Sputtered Al (nm) | Drive Voltage (v) | Luminance (cd/m$^2$) |
|---|---|---|---|---|---|---|---|
| 80 | Control |  | 0.5 | 70 |  | 5.8 | 500 |
| 81 | Sputtered Cathode | 0.4 | 0.5 |  | 70 | 5.9 | 530 |

TABLE 8-continued

Buffer, Cathode Structure, and Performance of a Control and Sputtered Cathode Devices Having 30 nm CuPc layer Deposited at Various Rates

| Device ID | Device Type | CuPc rate (nm/s) | LiF (nm) | Evaporated Al (nm) | Sputtered Al (nm) | Drive Voltage (v) | Luminance (cd/m$^2$) |
|---|---|---|---|---|---|---|---|
| 82 | Sputtered Cathode | 0.1 | 0.5 | | 70 | 5.6 | 527 |

Example 8

Table 9 compiles the buffer and cathode structure as well as performance of a device of the present invention and those of a control device.

The ITO, HIL, HTL and EML/ETL layers of devices 90 and 91 are identical and were deposited in a single-pump-down run. However, here instead of a 60 nm thick Alq that was generally used, a thin, 35 nm thick, Alq EML/ETL layer was employed. It should also be noted that a relatively thick CuPc layer was used, and a control device was not made. In this example the effectiveness of two dopant source layers are compared. Each device was provided with identical sputtered Al layer. The device 90 having a 0.5 nm LiF layer yields high efficiency and low operating voltage. The device 91 having a 0.5 nm thick CsF is not as efficient as the device 90, but it is believed its performance can be improved through optimization.

TABLE 9

Buffer, Cathode Structure, and Performance of Sputtered Cathode Devices Having Various Dopant Source Layers

| Device ID | Device Type | Buffer CuPc (nm) | LiF (nm) | CsF (nm) | Sputtered Al (nm) | Drive Voltage (v) | Luminance (cd/m$^2$) |
|---|---|---|---|---|---|---|---|
| 90 | Sputtered Cathode | 40 | 0.5 | | 50 | 4.6 | 655 |
| 91 | Sputtered Cathode | 40 | | 0.5 | 50 | 6.1 | 402 |

Example 9

Table 10 compiles the buffer, cathode structure and performance of some devices of the present invention and those of a control device. The ITO, HIL, HTL and EML/ETL layers of devices 100 through 105 are identical, and the organic layers were deposited in a single-pump-down run. This example includes dopant source layers of several compounds of alkali metals and sputtered metal layers of Al and Mg. The examples further include different thicknesses of a dopant source layer on a fixed CuPc buffer layer. The control device 100 having an evaporated Al layer is assumed to be free of damage during cathode deposition. The device 100 exhibits a luminance of 490 cd/m$^2$ and an operating voltage of 5.4 volt. The device 101 was provided with a 20 nm thick CuPc buffer layer on which a layer of 0.5 μm thick LiF layer was vapor deposited. Depositing a 70 nm thick Mg layer by sputtering completed the device fabrication. The performance of the sputtered cathode device 101 is virtually identical to that of the control device 100 indicating that a high efficiency electron injecting contact was formed by sputtering, and that the 20 nm thick CuPc buffer layer eliminated or minimized damage during sputtering. The device 102 is identical to device 101 in structure except that the dopant source layer is 0.5 μm thick RbNO$_3$. The performance data of these two devices indicate that RbNO$_3$ is as effective as LiF as a dopant source. The data for the device 103 having 0.5 nm thick RbF dopant source layer and sputtered Mg layer show slightly higher operating voltage but no degradation of luminescence efficiency. When sputtered Al was used in conjunction with thicker RbF or RbNO$_3$ dopant source and CuPc buffer as in the devices 104 and 105, the performance appears slightly reduced. It is believed, however, that the results can be improved by optimization of process parameters and device structure.

TABLE 10

Buffer, Cathode Structure, and Performance of a Control and Several Sputtered Cathode Devices

| Device ID | Device Type | Buffer CuPc (nm) | Dopant source (nm) | Evaporated Metal (nm) | Sputtered Metal (nm) | Drive Voltage (v) | Luminance (cd/m$^2$) |
|---|---|---|---|---|---|---|---|
| 100 | Control | | LiF (0.5) | Al (70) | | 5.4 | 490 |
| 101 | Sputtered Cathode | 20 | LiF (0.5) | | Mg (70) | 5.4 | 519 |

TABLE 10-continued

Buffer, Cathode Structure, and Performance of a Control and Several Sputtered Cathode Devices

| Device ID | Device Type | Buffer CuPc (nm) | Dopant source (nm) | Evaporated Metal (nm) | Sputtered Metal (nm) | Drive Voltage (v) | Luminance (cd/m$^2$) |
|---|---|---|---|---|---|---|---|
| 102 | Sputtered Cathode | 20 | RbNO$_3$ (0.5) | | Mg (70) | 5.6 | 501 |
| 103 | Sputtered Cathode | 20 | RbF (0.5) | | Mg (70) | 6.2 | 495 |
| 104 | Sputtered Cathode | 20 | RbF (1.0) | | Al (70) | 6.3 | 466 |
| 105 | Sputtered Cathode | 20 | RbNO$_3$ (1.0) | | Al (70) | 6.4 | 469 |

The above Examples 1 through 9 show that a thin dopant source layer comprising a compound of an alkali metal in conjunction with a buffer layer of CuPc and with a sputtered layer of Al or Mg results in high efficiency electron injecting contact for OLEDs. Although in these examples undoped Alq emitter was used the emissive layer may have been doped with one or more light-emitting materials. In accordance with the present invention the dopant source layer is deposited on a buffer layer, which in turn is laid on the ETL. The buffer layer includes CuPc, derivatives thereof or other plasma resistant materials can be very effective in protecting organic EL medium from damage during sputtering deposition metal or alloy layer. By eliminating sputter damage and promoting electron injection, the CuPc/dopant source/Sputtered Al or Mg combination makes the sputtered device essentially equal in performance to the control device having an evaporated LiF/Al cathode.

The invention has been described in detail with particular reference to certain preferred embodiments thereof, but it will be understood that variations and modifications can be effected within the spirit and scope of the invention.

PARTS LIST 100 organic light-emitting diode device
101 substrate
102 anode
103 hole-injection layer
104 hole-transport layer
105 emissive layer
106 electron-transport layer
107 buffer layer
108 dopant source layer
109 sputter cathode
110 voltage source
111 conductors

What is claimed is:

1. A method of making an OLED device, comprising the steps of
   a) providing a substrate;
   b) forming an anode of a conductive material over the substrate;
   c) depositing an emissive layer having an electroluminescent material provided over the anode layer;
   d) forming a buffer layer, provided over the emissive layer and including a phthalocyanine or derivatives thereof;
   e) depositing an electron-injecting dopant source layer and including a compound of an alkali metal or thermal decomposition products thereof;
   f) sputtering a metal or metal alloy layer provided over the electron injecting dopant source layer; and
   g) heat-treating in an inert div atmosphere.

2. The method of claim 1 wherein the sputtering is accomplished using either DC or RF power.

3. The method of claim 1 wherein the sputtering step is accomplished by sputtering materials from one or more targets.

4. The method of claim 1 wherein the electron injecting dopant source layer has a thickness less than 20 inn but greater than 0 nm.

5. The method of claim 1, wherein a metal target is sputtered to form the layer on said electron-injecting dopant source layer.

6. The method of claim 5, wherein the metal of the sputtered layer is aluminum or magnesium.

7. The method of claim 1, wherein the dopant source layer has a thickness less than 10 run but greater than 0 nm.

8. The method of claim 1, wherein the dopant source layer has a thickness between 0.2 nm and 5 nm.

9. The method of claim 1, wherein the buffer layer includes copper phthalocyanine or derivatives of copper phthalocyanine.

10. The method of claim 1, wherein the buffer layer has a thickness greater than 5 nm and less than 100 nm.

11. The method of claim 1, wherein the emissive layer includes Alq.

12. The method of claim 1, wherein the emissive layer contains one or more light-emitting doped materials.

13. A method of making an OLED device, comprising the steps of:
   a) providing a substrate;
   b) forming an anode of a conductive material over the substrate;
   c) depositing an emissive layer having an electroluminescent material provided over the anode layer;
   d) forming a buffer layer, provided over the emissive layer and including a phthalocyanine or derivatives thereof;
   e) depositing an electron-injecting dopant source layer and including a compound of an alkali metal or thermal decomposition products thereof;
   f) sputtering a metal or metal alloy layer provided over the electron injecting dopant source layer,
   wherein the electron injecting dopant source includes KF, RbF, CsF, KIO$_3$, RbNO$_3$, CsNO$_3$, C$_s$OOCCH$_3$, or a thermal decomposition product thereof.

14. A method of making an OLED device, comprising the steps of;
   a) providing a substrate;

b) forming an anode of a conductive material over the substrate;

c) depositing a hole-injection layer over the anode layer;

d) depositing a hole-transport layer over the hole-injection layer;

e) depositing an emissive layer having an electroluminescent material over the hole-transport layer;

d) forming a buffer layer, provided over the emissive layer and including a phthalocyanine or derivatives thereof;

e) depositing an electron-injecting dopant source layer and including a compound of an alkali metal or thermal decomposition products thereof;

f) sputtering a metal or metal alloy layer provided over the electron injecting dopant source layer.

15. The method of claim 14, additionally comprising heat treating in an inert dry atmosphere following said sputtering.

16. The method of claim 15, wherein the metal of the sputtered layer is aluminum or magnesium.

17. The method of claim 14, wherein a pure metal target is sputtered to form the layer on said electron-injecting dopant source layer.

18. The method of claim 14, wherein the electron injecting dopant source includes KF, RbF, CsF, $KIO_3$, $RbNO_3$, $CsNO_3$, $CsOOCCH_3$, or a thermal decomposition product thereof.

19. The method of claim 14, wherein the electron injecting dopant source layer has a thickness less than 20 nm but greater than 0 nm.

20. The method of claim 14, wherein the dopant source layer has a thickness less than 10 nm but greater than 0 nm.

21. The method of claim 14, wherein the dopant source layer has a thickness between 0.2 nm and 5 nm.

22. The method of claim 14, wherein the buffer layer includes copper phthalocyanine or derivatives of copper phthalocyanine.

23. The method of claim 14, wherein the buffer layer has a thickness greater than 5 inn and less than 100 nm.

24. The method of claim 14, wherein the emissive layer includes Alq.

25. The method of claim 14, wherein the emissive layer contains one or more light-emitting doped materials.

* * * * *

UNITED STATES PATENT AND TRADEMARK OFFICE
CERTIFICATE OF CORRECTION

PATENT NO. : 6,797,129 B2
DATED : September 28, 2004
INVENTOR(S) : Pranab K. Raychaudhuri et al.

It is certified that error appears in the above-identified patent and that said Letters Patent is hereby corrected as shown below:

<u>Column 16,</u>
Line 20, after "inert" delete "div" and insert -- dry --.
Line 27, after "less than 20", delete "inn" and insert -- nm --.
Line 35, after "less than 10" delete "run" and insert -- nm --.

<u>Column 17,</u>
Line 20, delete "pure".

<u>Column 18,</u>
Line 16, after "greater than 5" delete "inn" and insert -- nm --.

Signed and Sealed this

Third Day of January, 2006

JON W. DUDAS
*Director of the United States Patent and Trademark Office*